United States Patent [19]
Liew et al.

[11] Patent Number: 6,088,811
[45] Date of Patent: Jul. 11, 2000

[54] METHOD AND APPARATUS FOR GENERATING BOTH A UNIFORM DUTY CYCLE CLOCK AND A VARIABLE DUTY CYCLE CLOCK USING A SINGLE STATE MACHINE

[75] Inventors: Vui Yong Liew, Penang, Malaysia; Venkat Iyer, Portland, Oreg.

[73] Assignee: Intel Corporation, Santa Clara, Calif.

[21] Appl. No.: 08/941,796

[22] Filed: Sep. 30, 1997

[51] Int. Cl.[7] .................................................. G06F 1/04
[52] U.S. Cl. ........................................ 713/500; 713/501
[58] Field of Search ................................... 713/500, 501, 713/600; 327/175

[56] References Cited

U.S. PATENT DOCUMENTS 4,161,787   7/1979   Groves et al. ........................... 710/260
5,214,682   5/1993   Clark ........................................ 377/56
5,638,016   6/1997   Eitrheim ................................. 327/175

*Primary Examiner*—Dennis M. Butler
*Attorney, Agent, or Firm*—Blakely, Sokoloff, Taylor & Zafman LLP

[57] ABSTRACT

A method and apparatus for generating both a uniform duty cycle clock and a variable duty cycle clock with a single state machine. A single state machine is provided having a series of states through which it transitions when in a first mode. The series of states causes the output of the state machine to be a uniform duty cycle clock signal. The state machine has a second group of states through which it transitions in a second mode. A transition scheme among the second group of states permits the duty cycle of a state machine output clock signal to vary.

20 Claims, 5 Drawing Sheets

(Prior Art) Fig. 1

METHOD AND APPARATUS FOR GENERATING BOTH A UNIFORM DUTY CYCLE CLOCK AND A VARIABLE DUTY CYCLE CLOCK USING A SINGLE STATE MACHINE

BACKGROUND OF THE INVENTION (1) Field of the Invention

The invention relates to clock signal generation. More specifically, the invention relates to generation of transmit and receive clocks to satisfy Universal Serial Bus (USB) requirements.

(2) Related Art

The Universal Serial Bus (USB) is a high-speed serial bus following a protocol defined in Universal Serial Bus Specification, Version 1.0 (USB Spec). Modification of this specification can be expected from time to time. However, the USB spec provides a standardized approach for peripheral interconnection with a host computer. The USB is set up in a tiered topology with a host on the top tier and USB hubs and functions on subsequent tiers. Each USB device, whether it be a hub, the host, or a function, has associated therewith a serial interface engine (SIE) which provides an interface between the hub, host, or function and the transceiver which transmits or receives signals across the serial line. Generally, the SIE takes care of all the USB low level protocol matters such as bit stuffing, cyclic redundancy checks (CRCs), token generation, and hand-shaking.

To accomplish these required tasks, the SIE must generate a transmit clock SIGNAL and a receive clock signal. The transmit clock has a uniform duty cycle and operates at 12 MHz at full speed or 1.5 MHz for slow speed devices. The receive clock duty cycle may be stretched or shrunk, depending on data jitter present on the USB. The requirements for accommodating data jitter are discussed in the USB Spec, Section 7.1.13. Prior art techniques have typically employed two different sources to generate the transmit and receive clocks. A multiplexer is then employed to select between the transmit clock and the receive clock, depending on whether the interface is in a transmit mode or receive mode.

FIG. 1 shows an example of a prior art transmit and receive clock generator. In the figure, states are numbered with the hexadecimal value of their binary equivalents, and bracketed numbers correspond to the clock value supplied to a multiplexer 18 by a transmit state machine 16 and a receive state machine 17. The transmit clock is generated by a free-running state machine 16 responsive to an externally generated 48 megahertz clock (or 4x clock) at full speed (6 MHz for slow speed devices), the state machine having four states, 0 through 3, with the output clock being "0" in states 0 and 1, and "1" in states 2 and 3. Thus, this state machine effectively implements a divide by four to divide the 4x clock to generate a 1x transmit clock at the bit rate of the device. An externally generated reset signal 19 forces the state machine 16 into state 0.

A four bit digital phase lock loop (DPLL) state machine 17 is used to generate the receive clock. The DPLL state machine 17 is also clocked by the 4x clock. One of ordinary skill in the art will recognize how this four bit state machine satisfies the jitter requirements of the USB Spec by expanding or shrinking the duty cycle of the receive clock responsive to signals on the data line. If the data stream is perfect, the DPLL will follow the path 5→7→6→4→1→3→2→0→5. As the states are assigned, the received data can be derived by watching the second most significant bit of the state designations. The DPLL will continue cycling until a transmit indicator or an end of packet receive (EOPR) signal forces the DPLL back to an idle state (state C). The reset signal 19 always forces the receive state machine 17 into state C.

Because only one clock signal can be applied to the rest of the serial interface, in any mode, the transmit state machine 16 and the receive state machine 17 are coupled through the multiplexer 18 so that a single 1x clock signal is supplied to the rest of the serial interface engine and the device. The multiplexor 18 adds delay in the clock path. Additionally, synthesis of the multiplexer 18 is quite difficult and requires great effort to ensure operability at all operating conditions. Switching between the transmit clock and the receive clock often causes a glitch in the signal which can cause the SIE to malfunction. To avoid this glitch-precipitated malfunction, the multiplexer 18 must be custom-designed to insure that neither clock will toggle while switching is occurring. Such customization is both design intensive and inflexible, requiring redesigns for each new version of an underlying product.

In view of the foregoing, it would be desirable to be able to generate the receive and transmit clock signals having increased flexibility and reduced design effort and cost without decreasing functionality over that which exists today and without deviating from the USB Spec.

BRIEF SUMMARY OF THE INVENTION

A method and apparatus for generating both a uniform duty cycle clock and a variable duty cycle clock with a single state machine is disclosed. A single state machine is provided having a series of states through which it transitions when in a first mode. The series of states causes the output of the state machine to be a uniform duty cycle clock signal. The state machine has a second group of states through which it transitions in a second mode. A transition scheme among the second group of states permits the duty cycle of a state machine output clock signal to vary.

DETAILED DESCRIPTION OF THE INVENTION

Figure 1:
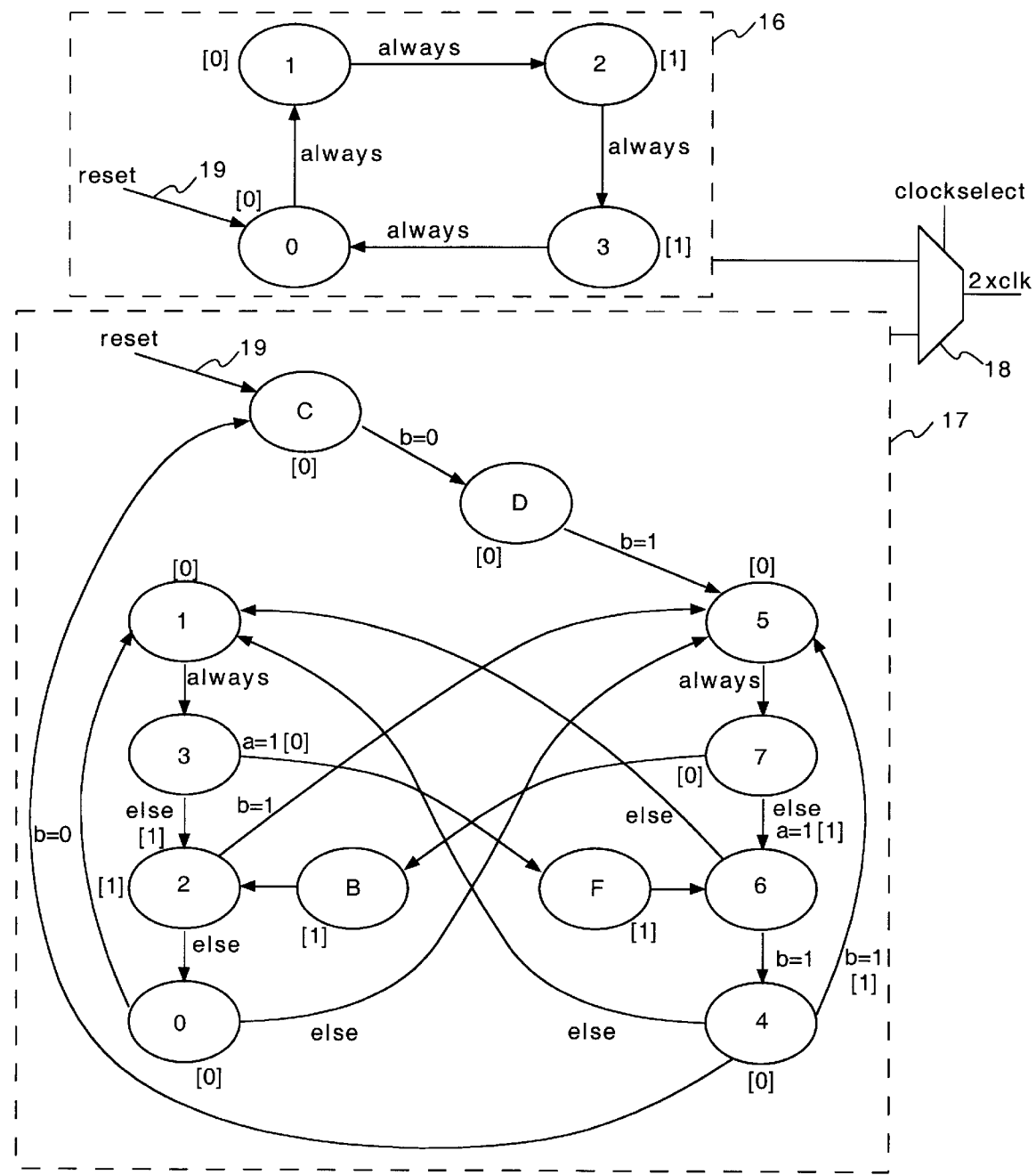
FIG. 1 is an example of a prior ore transmit and review clock generator.
Figure 2:
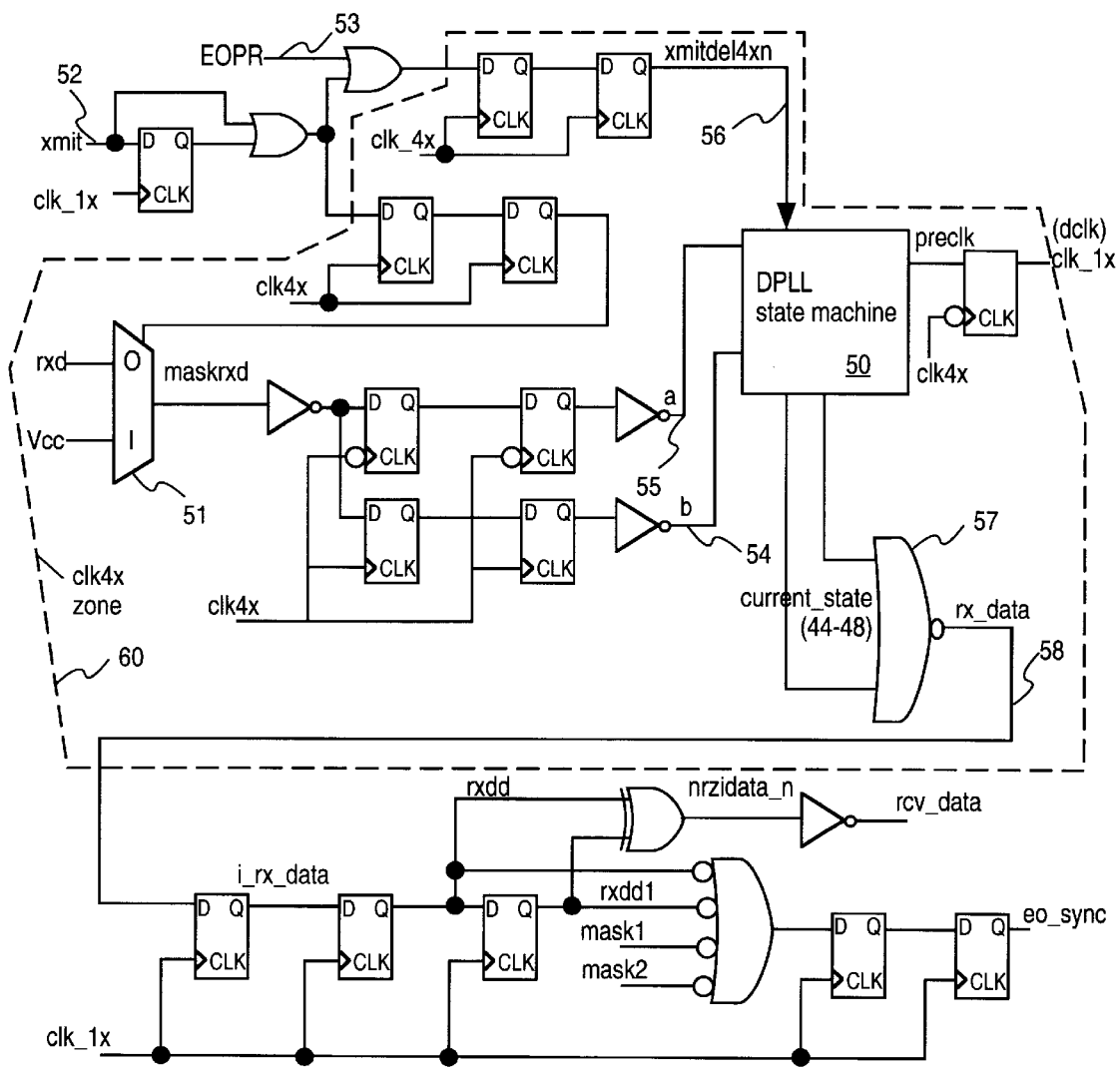
FIG. 2 is a block diagram of the clock generation circuit of one embodiment of the invention.

FIG. 2 is a block diagram of the clock generation circuit of one embodiment of the invention. In this embodiment, an externally generated 4x clock is applied to all components within the 4x clock zone 60. The 4x clock is 48 MHz for full speed USB devices and 6 MHz for slow speed USB devices. The heart of the clock generation circuit is the digital phase lock loop (DPLL) state machine 50 which is responsive to three signals (and an optional fourth signal discussed below). A first signal, "b" 54, is always high in transmit mode and tracks the incoming data in receive mode. A second signal, "a" 55, is a phase shift of the first signal b 54. A third signal, "xmitdel4xn," is asserted when the device enters transmit mode by the assertion of a xmit signal 52 or when an end of packet received (EOPR) signal 53 is asserted. The xmit signal 52 is asserted when the underlying device enters transmit mode. The xmit signal 52 through a series of flip-flops serves as a select signal for mode select multiplexer 51. The inputs of mode select multiplexer 51 are incoming receive data stream, and $V_{cc}$ corresponding to a "zero" select and a "one" select, respectively. The output of the multiplexer becomes signals a 55 and b 54 to which the state machine 50 is responsive. The interaction of the state machine with the various input signals is described in greater detail in connection with FIG. 3 below.

A data extractor 57 extracts receive data from the state machine 50 by performing a NORing operation on current state information corresponding to the states 44 through 48 (described below). For example, the output of the data extractor will be a logical one if the state machine is not in any of the states 44–48. Otherwise, it will be a logical zero. This NORing operation extracts synchronized receive data (rx_data) 58 which can readily be decoded consistent with the prior art. The clock output of the state machine 50 in this embodiment is phase shifted to generate the 1x clock supplied to the rest of the device.

Figure 3:
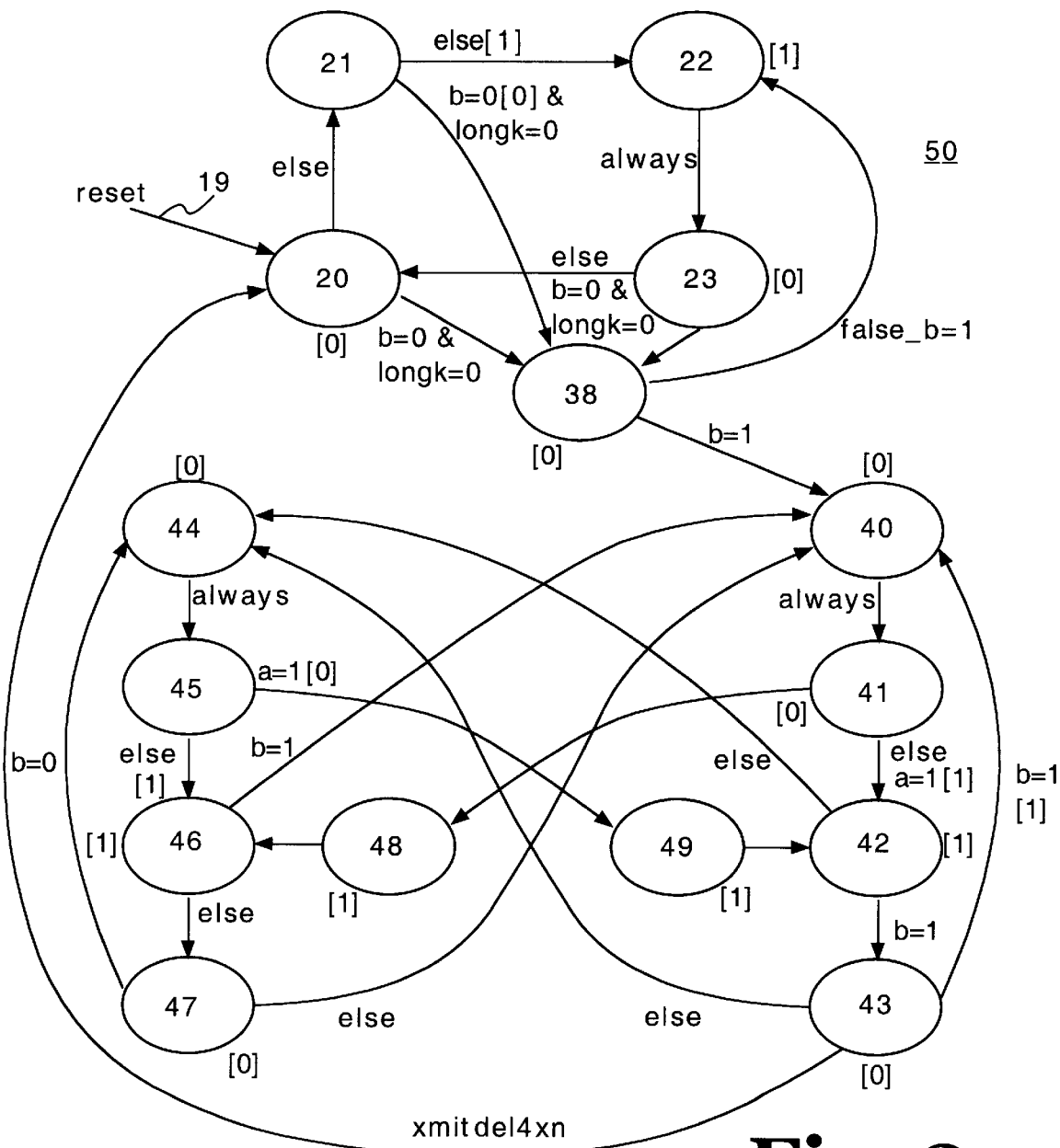
FIG. 3 shows one embodiment of the DPLL state machine of the invention.

FIG. 3 shows one embodiment of the DPLL state machine of the invention. Assertion of the reset signal 19 forces the state machine into an initial state 20. From initial state 20, if b is not equal to 0 and longk is not equal to 0 (longk is an additional input signal which is optional and will be discussed further below). The state machine transitions through states 21, 22, and 23 and back to state 20. This effectively provides a divide by 4 uniform duty cycle transmit clock. If b is 0 at states 20, 21, or 23, the state machine will transition into intermediate state 38. To avoid loss of data, state 22 will not transition directly to intermediate state 38. This is because once the clock has been asserted on the transition from state 21 to state 22, the clock must remain asserted for another 4x clock cycle to insure sufficient time for a transmit to complete.

As discussed above in connection with FIG. 2, the b signal can only go to 0 if the xmit signal is deasserted. As otherwise, the mode selection multiplexer sources $V_{cc}$ making b always a logical one. From intermediate state 38, if b has not gone to a logical one within the predetermined amount of time dictated by a time-out counter, false_b is asserted and the state machine transitions to state 22. The time-out counter is provided to avoid the state machine to locking up in the intermediate state 38. In an embodiment in which the optional longk signal is omitted, transitions from states 20, 21, and 23 are controlled solely by the b signal. Specifically, if b=0, a transition will occur to the intermediate state 38. Once false b is asserted by the time-out counter, the state machine will transition to state 22 which always transitions to state 23 which in turn transitions to intermediate state 38 anytime b=0. Accordingly, the state machine can get caught in a loop of 38→22 →23→38. While this loop has no serious negative implications, it can cause a peculiar looking clock wave form such as 9 cycles of 0 followed by one cycle of 1.

Figure 4:
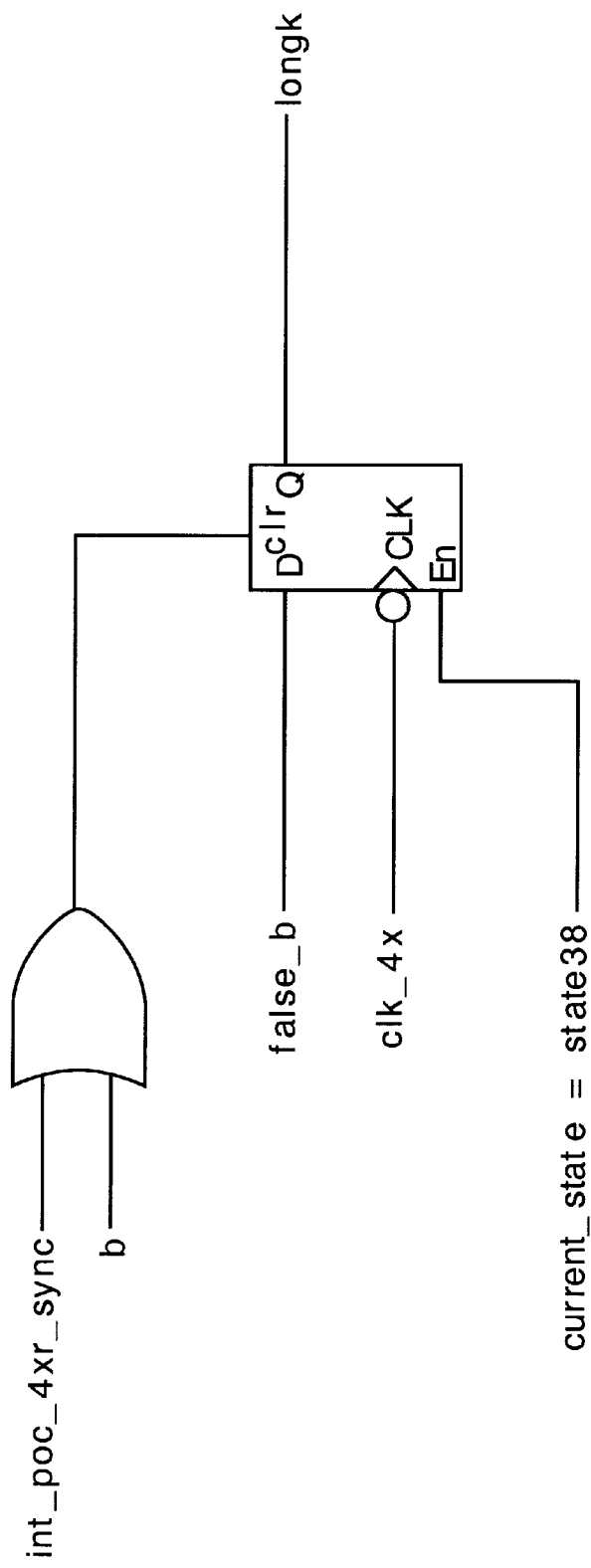
FIG. 4 is a diagram showing the generation of the long k signal in one embodiment of the invention.

In an alternate embodiment (shown in FIG. 3), a longk signal is used in conjunction with the b signal to control transitions to the intermediate state 38. When longk is asserted, it disables transition to the intermediate state 38. In this embodiment, the peculiar clock wave form mentioned above is avoided easily with minimal cost. FIG. 4 is a diagram showing the generation of the longk signal in one embodiment of the invention. A D flip-flop is clocked by a phase shifted 4x clock and is enabled when a current state equals intermediate state 38. When enabled, the longk signal tracks the false_b signal. False_b is latched into the D flip-flop and longk is thereafter maintained asserted until cleared by receipt of either the assertion of b (b=1) or the signal int_poc_4xr_sync. The int_poc_4xr_sync is a reset signal synchronized with the rising edge of the 4x clock.

If at intermediate state 38 b=1, the state machine transitions into state 40. The state machine will then transition appropriately through states 40 through 49 as dictated by the transitions and their jitter in the receive line. This cycling will continue until xmitdel4xn is asserted at state 43 (or reset is asserted). In either case, the state machine will transition back to initial state 20.

In one embodiment, the state machine is implemented as a 4-bit state machine. However, no arrangement of the states permits extraction of the receive data merely by watching any single bit of the state designation as was possible in the prior art. This necessitates an alternative data extraction method such as the one described in connection with FIG. 2. Additionally, because of the speed at which the state machine must operate (consistent with the 4x clock), it is desirable to implement the state machine as a one-hot device. By one-hot device, it is meant that for each state, a single logical line is asserted high. Thus, the state machine having fifteen states requires fifteen distinct signal lines for state assertion. This one-hot feature results in a very large number of undefined states. Unfortunately, if the state machine enters an undefined state, it is not guaranteed recoverable. Using an asynchronous reset to reset the DPLL state machine will result in unstable performance, e.g., it works on one voltage range, but fails on another voltage window. This failure occurs because when the reset is deasserted, depending on when exactly the reset signal is deasserted on each of the state machine state registers, some state registers may reset earlier and others later. If the state register that is active during reset is deasserted earlier than the next state register (remember, it is one hot, one and only one register active at any time), then the active signal will not be able to pass to the next register and as a result, the state machine enters an undefined state: all registers inactive. On the other hand, if the reset in the first register is deasserted later than the one after it, the result will be two registers will be active at the same time; another undefined state! All the undefined states mentioned above are fatal to the DPLL state machines.

To avoid entering any undefined state, in one embodiment, the reset signal of DPLL state machine is asynchronously asserted, but synchronously deasserted. To further guarantee that no similar problem occurs in SIE, all other reset signals are done in the same way. Generally, registers that use the rising edge of the 1x clock use a reset signal that is deasserted by the falling edge of the 1x clock, whereas registers that use the falling edge of the 1x clock use a reset signal that is deasserted by the rising edge of the 1x clock. This is applicable to registers that use clk4x also. By following these rules, it is guaranteed that when the reset signal is deasserted, the DPLL and other state machines (in the SIE) will be in a determine state.

Figure 5:
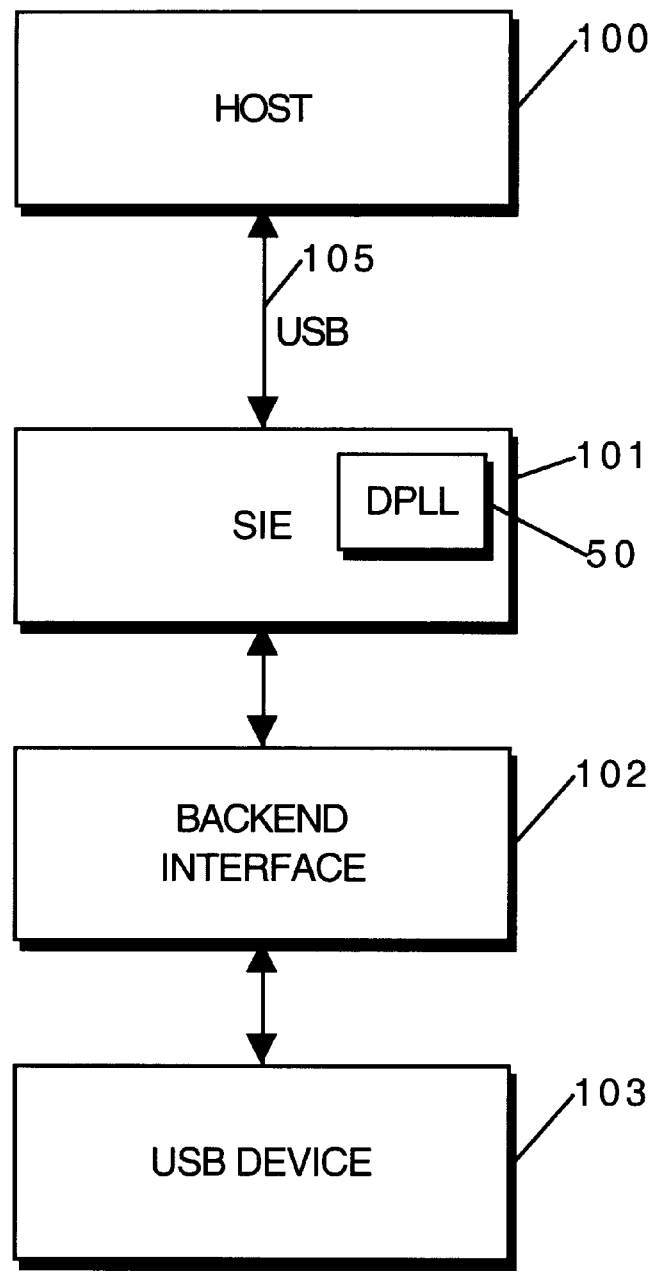
FIG. 5 is a block diagram of a system employing one embodiment of the invention.

FIG. 5 is a block diagram of a system employing one embodiment of the invention. A host processor 100 is coupled to an SIE 101 by a USB 105. The SIE 101 contains DPLL state machine 50 which generates both a transmit clock and a receive clock as described above. The SIE 101 is also coupled to a backend interface 102 which provides an interface between the SIE 101 and the USB device 103. The SIE receives data from the host 100 and transmits data from the USB device 103 over the USB 105. The DPLL state machine provides the necessary clock signals to carry out the transmission and receipt of data over the USB 105.

In the foregoing specification, the invention has been described with reference to specific embodiments thereof. It will, however, be evident that various modifications and changes can be made thereto without departing from the broader spirit and scope of the invention as set forth in the appended claims. The specification and drawings are, accordingly, to be regarded in an illustrative rather than a restrictive sense. Therefore, the scope of the invention should be limited only by the appended claims.

What is claimed is:

1. An apparatus comprising:
    a single digital phase lock loop (DPLL) state machine which generates a uniform duty cycle clock in a first mode and a variable duty cycle clock in a second mode.
2. An apparatus comprising:
    a single digital phase lock loop (DPLL) state machine which generates a uniform duty cycle clock in a first mode and a variable duty cycle clock in a second mode;
    a time out counter to indicate if a time for a transition of a first signal has been exceeded; and
    a transition path disabling signal generation circuit which generates a disable signal to prevent a transition to an intermediate state, responsive to the timeout counter timing out while a predetermined condition exists.
3. An apparatus comprising:
    a single digit phase lock loop (DPLL) state machine which generates a uniform duty cycle clock in a first mode and a variable duty cycle clock in a second mode, wherein the state machine is responsive to a first signal, the first signal always asserted when a transmit is occuring, the first signal mirroring a received data during a receive transaction; and wherein the state machine is responsive to a second signal that is a phase shift of the first signal.
4. The apparatus of claim 3 wherein the state machine comprises:
    a first portion including an initial state, a second state, a third state, and a fourth state;
    an intermediate state to which the initial state, the second state, and the fourth state transition responsive to the deassertion of the first signal; and
    a plurality of receive states which vary a duty cycle of variable duty cycle clock responsive to the first and second signals.
5. The apparatus comprising:
    a single digital phase lock loop (DPLL) one hot state machine which generates a uniformm duty cycle click in a first mode and a variable duty cycle clock in a second mode.
6. The apparatus of claim 5 further comprising:
    a receiving data extractor which performs a NORing operation on current state data to extract the data recived.
7. The apparatus of claim 5 further comprising a reset signal that forces the state machine into an initial state, the reset signal being asynchronously asserted and synchronously deasserted.
8. The apparatus of claim 7 wherein for registers in the state machine using a rising edge of a clock signal, the reset signal is deasserted on a falling edge of the clock signal, and for registers in the state machine using the falling edge of the clock signal, the reset signal is deasserted on the rising edge of the clock signal.

9. A method comprising the steps of:
    transitioning, in a state machine, from an initial state through a series of four states while a first signal is asserted, an output of the state machine being asserted in a second state and a third state of the series of four states and deasserted in the initial state and the fourth state of the series; and
    transitioning directly to an intermediate state from any of the initial, second and fourth states of the series of four states responsive to a deassertion of the first signal.
10. The method of claim 9 further comprising the step of:
    phase shifting the output of the state machine to be synchronized with a falling edge of an externally generated clock signal.
11. The method of claim 10 further comprising the steps of:
    transitioning from the intermediate state through a plurality of receive states responsive to the first signal and a second signal, the second signal a phase shift of the first signal; and
    returning to an initial state if a third signal is asserted at the end of a cycle.
12. The method of claim 11 further comprising the step of:
    NORing a plurality of current state signals to extract data received.
13. The method of claim 9 further comprising the steps of:
    disabling transition paths between the series of four states and the intermediate path if a timeout occurred during a previous intermediate state; and
    reenabling the transition paths if the first signal has been asserted since the timeout.
14. The method of claim 9 further comprising the steps of:
    a synchronously asserting a reset signal to the state machine; and
    synchronously deasserting the reset signal.
15. A system comprising:
    a host processor;
    a serial bus couple to the host processor; and
    a serial interface engine (SIE) coupled to the serial bus, the SIE containing a state machine generating each of a uniform duty cycle clock signal in a first mode and a variable duty cycle clock signal in a second mode.
16. A system comprising:
    a host processor:
    a serial bus coupled to the host processor;
    a serial interface engine (SIE) coupled to the serial bus, the SIE containing a state machine geneating each of a uniform cycle duty clock signal in a first mode and a variable duty cycle clock signal in a second mode;
    a time out counter to indicate if a time for a transition of a fist signal has been exceeded; and
    a transition path disabling signal generation circuit which generates a disable signal to prevent a transition to an intermediate state, responsive to the timeout counter timing out while a predetermined condition exists.
17. A system comprising:
    a host processor;
    a serial bus coupled to the host processor; and
    a serial interface engine (SIE) coupled to the serial bus, the SIE containing a state machine generating each of a uniform duty cycle clock signal in a first mode and a variable duty cycle clock signal in a second mode;

wherein the state machine includes:
  a first portion including an initial state, a second state, a third state, and a fourth state;
  an intermediate state to which the initial state, the second state, and the fourth state transition responsive to the deassertion of a first signal; and
  a plurality of receive states which vary a duty cycle of variable duty cycle clock responsive to the first signal which mirrors the received data and a second signal which is a phase shift of the first signal.

18. A system comprising:
  a host processor;
  a serial bus coupled to the host processor; and
  a serial interface engine (SIE) coupled to the serial bus, the SIE containing a one hot state machine generating each of a uniform duty cycle clock signal in a first mode and a variable duty cycle clock signal in a second mode.

19. The system of claim 18 further comprising:
  a receive data extractor which performs a NORing operation on current state data to extract the data received.

20. The system of claim 18 further comprising a reset signal that forces the state machine into an initial state, the reset signal being asynchronously asserted and synchronously deasserted.

* * * * *